(12) United States Patent
Lai et al.

(10) Patent No.: US 9,921,480 B2
(45) Date of Patent: Mar. 20, 2018

(54) EXTREME ULTRAVIOLET PHOTORESIST

(71) Applicant: Taiwan Semiconductor Manufacturing Co., Ltd., Hsin-Chu (TW)

(72) Inventors: Wei-Han Lai, New Taipei (TW); Ching-Yu Chang, Hsin-Chu (TW); Chien-Wei Wang, Hsinchu County (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 15/040,173

(22) Filed: Feb. 10, 2016

(65) Prior Publication Data

US 2017/0227851 A1    Aug. 10, 2017

(51) Int. Cl.
| G03F 7/039 | (2006.01) |
| G03F 7/32 | (2006.01) |
| G03F 7/075 | (2006.01) |
| G03F 7/20 | (2006.01) |

(52) U.S. Cl.
CPC .......... *G03F 7/2004* (2013.01); *G03F 7/039* (2013.01); *G03F 7/075* (2013.01); *G03F 7/32* (2013.01)

(58) Field of Classification Search
None
See application file for complete search history.

(56) References Cited

U.S. PATENT DOCUMENTS

| 5,738,972 | A | * | 4/1998 | Padmanaban | ......... G03F 7/0045 430/170 |
| 6,114,462 | A | * | 9/2000 | Watanabe | ............. G03F 7/0045 525/191 |
| 7,655,378 | B2 | * | 2/2010 | Hatakeyama | ......... G03F 7/0382 430/270.1 |
| 8,216,767 | B2 | | 7/2012 | Wang et al. | |
| 8,323,870 | B2 | | 12/2012 | Lee et al. | |
| 8,580,117 | B2 | | 11/2013 | Kao et al. | |
| 8,658,344 | B2 | | 2/2014 | Wang et al. | |
| 8,715,919 | B2 | | 5/2014 | Chang et al. | |
| 8,741,551 | B2 | | 6/2014 | Wu et al. | |

(Continued)

FOREIGN PATENT DOCUMENTS

| JP | 2008-088275 | * | 4/2008 |
| JP | 2009-244803 | * | 10/2009 |
| JP | 2010-175859 | * | 8/2010 |

OTHER PUBLICATIONS

Machine translation of JP 2010-175859 (2010).*

(Continued)

*Primary Examiner* — Martin Angebranndt
(74) *Attorney, Agent, or Firm* — Haynes and Boone, LLP

(57) ABSTRACT

The present disclosure provides a method for lithography patterning in accordance with some embodiments. The method includes forming a photoresist layer over a substrate; performing an exposing process to the photoresist layer; and developing the photoresist layer, thereby forming a patterned photoresist layer. The photoresist layer includes a polymer backbone, an acid labile group (ALG) bonded to the polymer backbone, a first sensitizer that is bonded to the polymer backbone, a second sensitizer that is not bonded to the polymer backbone, and a photo-acid generator (PAG).

20 Claims, 8 Drawing Sheets

(56) References Cited

U.S. PATENT DOCUMENTS

| | | | |
|---|---|---|---|
| 2001/0038971 A1* | 11/2001 | Ohsawa | G03F 7/0392 |
| | | | 430/270.1 |
| 2002/0015913 A1* | 2/2002 | Uetani | C07C 381/00 |
| | | | 430/270.1 |
| 2009/0111053 A1* | 4/2009 | Yamashita | G03F 7/0392 |
| | | | 430/286.1 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

OTHER PUBLICATIONS

Machine translation of JP 2009-244803 (2009).*
Machine translation of JP 2008-088275 (2008).*
Juting Torok, Ryan Del Re, Henry Herbol, Sanjana Das, Irina Bucharos, Angela Paolucci, Leonidas F. Ocula, Carl Ventrice Jr., Eric Lifshin, Greg Denbeaux and Robert L. Brainard, "Secondary Electrons in EUV Lithography," Journal of Photopolymer Science and Technology, vol. 26, No. 5 (2013) 625-634 © 2013SPST.

* cited by examiner

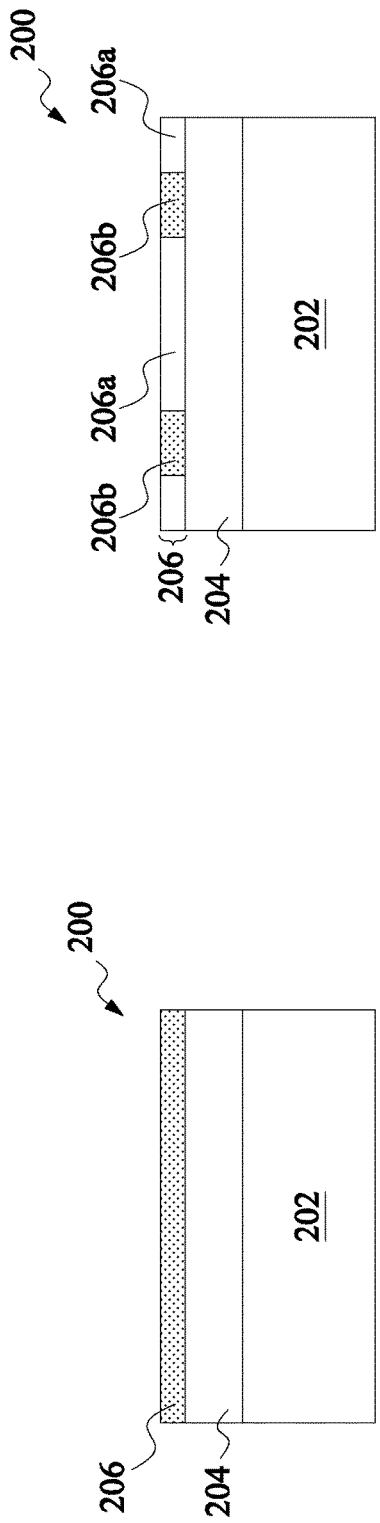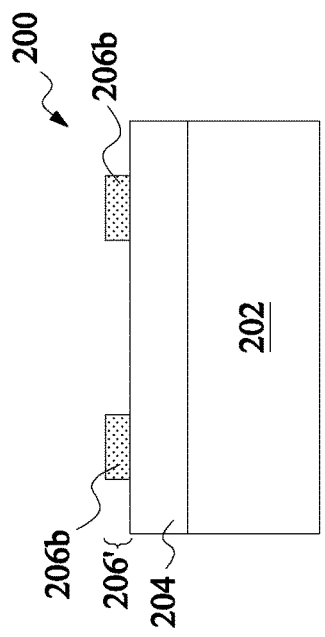

EXTREME ULTRAVIOLET PHOTORESIST

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, extreme ultraviolet (EUV) lithography has been utilized to support critical dimension (CD) requirements of smaller devices. EUV lithography employs scanners using radiation in the EUV region, having a wavelength of about 1 nm to about 100 nm. Some EUV scanners provide 4× reduction projection printing onto a resist film coated on a substrate, similar to some optical scanners, except that the EUV scanners use reflective rather than refractive optics. EUV lithography has imposed a complex set of requirements upon the resist film. Although existing methods of fabricating IC devices have been generally adequate for their intended purposes, they have not been entirely satisfactory in all respects. For example, EUV lithography has imposed a complex set of requirements upon the resist film. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D and 2E illustrate cross sectional views of a semiconductor structure at various fabrication stages, in accordance with some embodiments.

DETAILED DESCRIPTION

Figure 1:
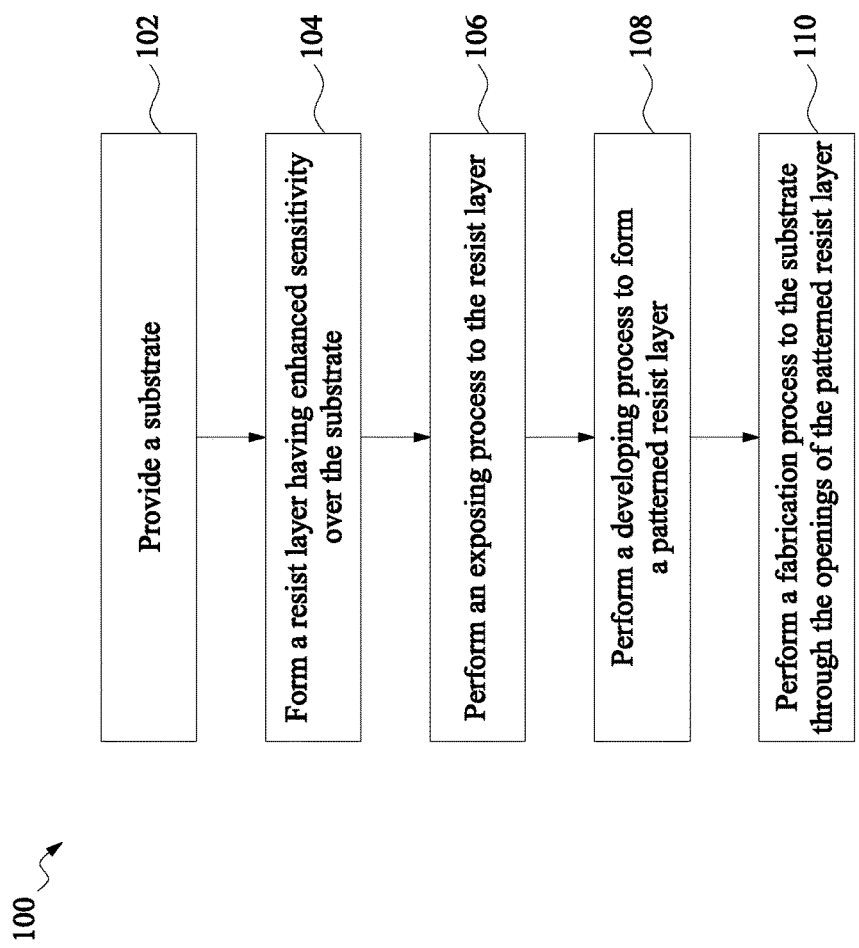
FIG. 1 illustrates a flow chart of a lithography patterning method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of photosensitive films in extreme ultraviolet (EUV) lithography and methods of using the same. In lithography patterning, after a resist film is exposed to a radiation, such as a EUV radiation (or alternatively other radiation, such as an electron beam), it is developed in a developer (a chemical solution). The developer removes portions (such as exposed portions as in a positive-tone photoresist or unexposed portions as in a negative-tone photoresist) of the resist film, thereby forming a resist pattern which may include line patterns and/or trench patterns. The resist pattern is then used as an etch mask in subsequent etching processes, transferring the pattern to an underlying material layer. Alternatively, the resist pattern is then used as an ion implantation mask in subsequent ion implantation processes applied to the underlying material layer, such as an epitaxial semiconductor layer.

Generally, to produce the smallest possible circuitry, today's most advanced lithography systems are designed to use light of very short wavelength such as for example, deep-ultraviolet light at a wavelength at or below 200 nm, or extreme ultraviolet (EUV) in the region of about 13.5 nm. Such light sources are relatively weak, so the photosensitive films (e.g., a photoresist) need to be designed to utilize this light as efficiently as possible. Essentially photoresists used today for microelectronic/nanoelectronic fabrication employ the concept of chemical amplification to enhance the efficiency of light utilization.

A photoresist that employs the chemical amplification is generally referred to as a "chemically amplified resist (CAR)". The photoresist includes a polymer that resists to etching or ion implantation; an acid generating compound (e.g., photo acid generator (PAG)); and a solvent. In some examples, the polymer also includes at least one acid labile group (ALG) that responds to acid. However, the PAG is not sensitive enough to the EUV radiation. A polyhydroxystyrene (PHS) group may be further bonded to the polymer to enhance the sensitivity of the photoresist. The number of sites on the polymer backbone that are available to be bonded to PHS or ALG is limited. Such a limited number results in a trade-off between the loading/bonding amounts of PHS and ALG. That is, advance to improve lithography efficiency (e.g., resolution/contrast, line-width-roughness, sensitivity) encounters issues because of this trade-off. In a non-limiting example, as identified above, the PHS generally serves as a sensitizer to increase sensitivity to EUV lights. That is, the more the PHS is included in a photoresist, the better of sensitivity the photoresist may provide. However, the trade-off between the loading/bonding amounts of PHS and ALG onto a backbone of a photoresist exists. That is, an over-loaded amount of PHS (bonded to a backbone of) a photoresist may in turn result in various disadvantageous effects such as, for example, a decreased amount of ALG (bonded to the backbone of) the photoresist. Thus, an object of the present disclosure is to provide a new and improved photoresist that is not subjected to the aforementioned limited loading amount of PHS and ALG, while achieving high pattern fidelity in advanced lithography processes.

FIG. 1 is a flow chart of a method 100 of patterning a substrate (e.g., a semiconductor wafer) according to various aspects of the present disclosure in some embodiments. The method 100 may be implemented, in whole or in part, by a system employing advanced lithography processes such as deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 100, and some operations described can be replaced, eliminated, or moved around for additional embodiments of the method.

FIGS. 2A through 2E are sectional views of a semiconductor structure 200 at various fabrication stages, constructed in accordance with some embodiments. The method 100 is described below in conjunction with FIG. 1 and FIGS. 2A through 2E wherein the semiconductor structure 200 is fabricated by using embodiments of the method 100. The semiconductor device 200 may be an intermediate device fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring now to FIG. 1 in conjunction with FIG. 2A, the method 100 begins at block 102 in which a substrate 202 is provided. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 202 includes an underlayer (or material layer) 204 to be processed, such as to be patterned or to be implanted. For example, the underlayer 204 is a hard mask layer to be patterned. In another example, the underlayer 204 is an epitaxial semiconductor layer to be ion implanted. However, in an alternative embodiment, the substrate 202 may not include an underlayer and an underlayer (e.g., 204) is optionally formed over the substrate 202. In an embodiment, the underlayer 304 is a hard mask layer including material(s) such as silicon oxide, silicon nitride (SiN), silicon oxynitride, titanium nitride, or other suitable material or composition. In an embodiment, the underlayer 304 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In some embodiments, the structure 200 may be alternatively a mask used to pattern a semiconductor wafer. In furtherance of the embodiments, the substrate 302 is a mask substrate that may include a transparent material (such as quartz), or a low thermal expansion material such as silicon oxide-titanium oxide compound. The mask substrate 202 may further include a material layer to be patterned. To further this example, the substrate 202 may be a mask substrate for making a deep ultraviolet (DUV) mask, an extreme ultraviolet (EUV) mask, or other types of masks. Accordingly, the underlayer 204 is material layer to be patterned to define a circuit pattern. For example, the underlayer 204 is an absorber layer, such as chromium layer.

The method 100 proceeds to operation 104 with forming a photoresist layer (or simply resist layer) 206 over the substrate 202 (FIG. 2B). The resist layer 206 is sensitive to radiation used in a lithography exposure process and has a resistance to etch (or implantation). Referring to FIG. 2B, in an embodiment, the resist layer 206 is formed by spin-on coating process. In some embodiments, the resist layer 206 is further treated with a soft baking process. In some embodiments, the resist layer 206 is sensitive a radiation, such as I-line light, a DUV light (e.g., 248 nm radiation by krypton fluoride (KrF) excimer laser or 193 nm radiation by argon fluoride (ArF) excimer laser), a EUV light (e.g., 135 nm light), an electron beam (e-beam), and an ion beam. In the present embodiment, the resist layer 206 is sensitive to EUV radiation. In some examples, the resist layer 206 is soluble in a positive tone developer after being exposed by EUV radiation.

The resist layer 206 may include a photosensitive chemical, a polymeric material and a solvent. In some embodiments, the resist layer 206 utilizes a chemical amplification (CA) resist material. For example, the CA resist material is positive tone and includes a polymer material that turns soluble to a developer after the polymeric material is reacted with acid. In another example, the CA resist material is negative tone and includes a polymer material that turns insoluble to a developer such as a base solution after the polymer is reacted with acid. In yet another example, the CA resist material includes a polymer material that changes its polarity after the polymer is reacted with acid.

Figure 3:
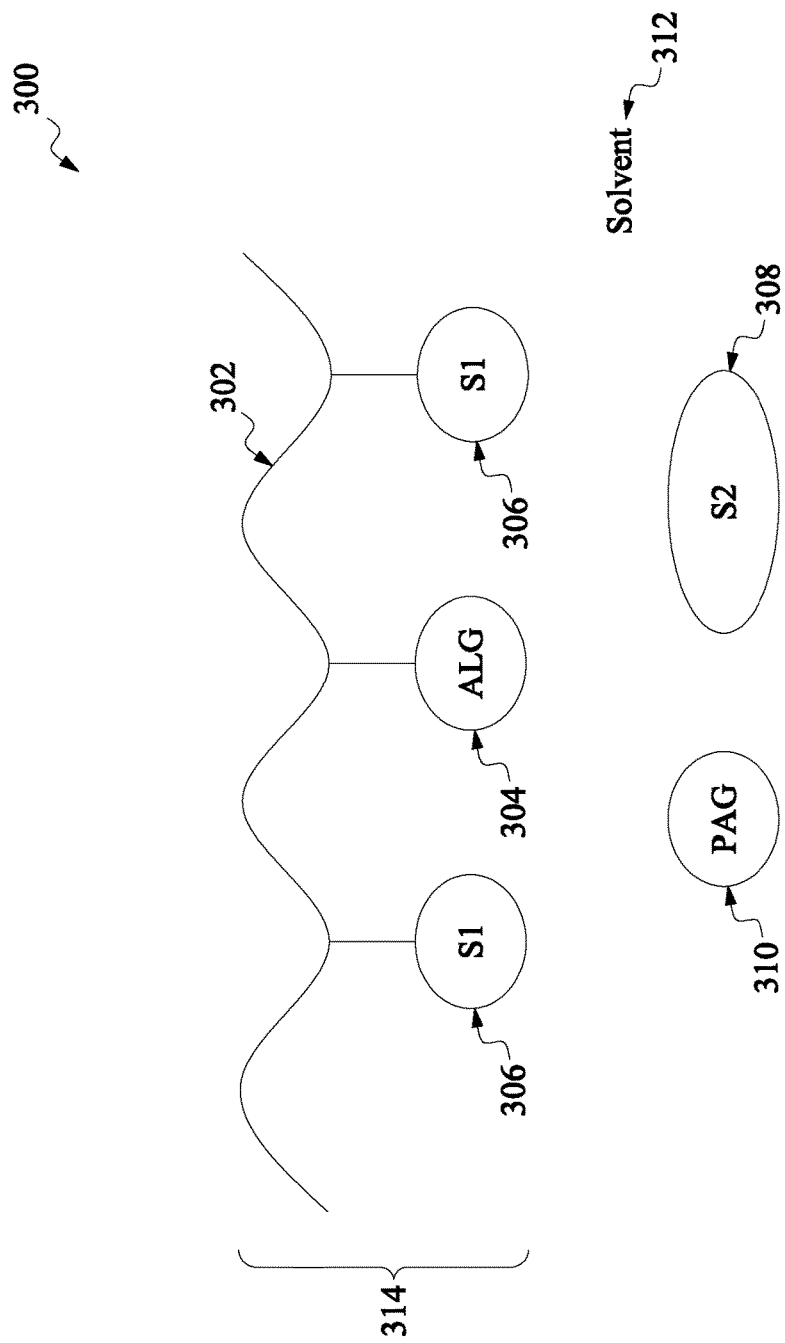
FIG. 3 illustrates a photoresist material of FIG. 2A in accordance with some embodiments.

FIG. 3 shows an embodiment of a resist material 300 of the resist layer 206, constructed in accordance with some embodiments. The resist material 300 is sensitive to a first radiation, such as extreme ultraviolet (EUV) light. The first radiation has a first wavelength. The resist material 300 includes a polymer backbone 302, an acid labile group (ALG) 304 bonded to the polymer backbone 302, a first sensitizer 306 that is bonded to the polymer backbone 302, a second sensitizer 308 that is not bonded to the polymer backbone 302, and a photo-acid generator (PAG) 310. The resist material 300 further includes solvent 312. In some embodiments, the resist material 300 may include other additives, such as quencher. The polymer backbone 302, the ALG 304 and the first sensitizer 306 are chemically bonded to form a first polymer 314. The second sensitizer 308 and the PAG 310 are blended with the first polymer in the solvent 312.

Figure 4:
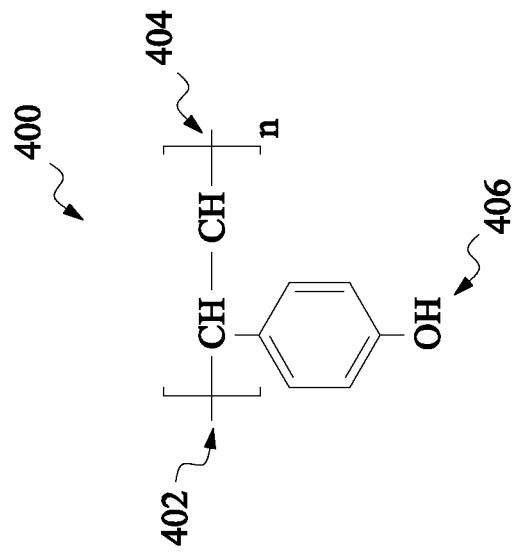

The polymer backbone 302 provides resistance to etch (or implantation). In various embodiments, the polymer backbone 302 includes an acrylate-based polymer, a poly(nor-bornene)-co-malaic anhydride (COMA) polymer, or a polyhydroxystyrene (PHS) polymer. For example, the acrylate-based polymer includes a poly (methyl methacrylate) (PMMA) polymer. The PHS polymer includes a plurality of PHS chemical structure 400 shown in FIG. 4, in which n is an integer greater than 2. The PHS chemical structure 400 includes two ends 402 and 404 that are chemically linkable with each other. Accordingly, a plurality of the chemical structures 400 are chemically bonded together (through the two ends 402 and 404), forming a PHS polymer backbone. The polymer backbone 302 also includes multiple side locations that may chemically bond with other chemical groups. For example, the PHS polymer backbone includes a plurality of hydroxyl (OH) groups 406 as side locations.

Figure 5:
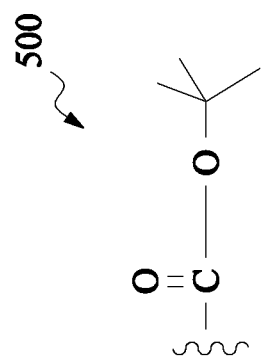
FIGS. 4, 5 and 7 illustrate chemical structures in the photoresist material of FIG. 3 in accordance with an embodiment.

The ALG 304 is chemically bonded to a side location of the polymer backbone 302, such as a hydroxyl (OH) group 406 of PHS polymer backbone 302. The ALG 304 is a chemical group that protects the polymer backbone 302 and will change in response to acid. For example, the ALG 304 will separate from the polymer backbone 302 upon the presence of acid and therefore loses the protection to the polymer backbone 302. Thus, the exposed resist material 300 will be chemically changed and behave differently in a developer. For example, the exposed resist material will have a chemical polarity changed. In another example, the exposed resist material has an increased dissolubility in a developer (for a positive-tone resist) or decreased dissolubility in a developer (for a negative-tone resist). When the exposing dose of the lithography exposing process reaches a dose threshold, the exposed positive-tone resist material will be dissoluble in the developer or the exposed negative-tone resist material will be soluble in the developer. In one embodiment, the ALG 304 includes a t-butoxycardbonyl (tBOC) 500 illustrated in FIG. 5.

The first sensitizer 306 is chemically bonded to a side location of the polymer backbone 302. For example, the first sensitizer 306 is bonded to an OH group 406 of the PHS polymer backbone 302. The first sensitizer 306 is designed to be able to generate a second radiation having a second wavelength in response to the first radiation. The second wavelength is greater than the first wavelength. In the present embodiment, the first radiation is EUV light and the first wavelength is about 13.5 nm; and the second wavelength ranges between 180 nm and 250 nm. The first sensitizer 306 absorbs the first radiation and radiates the second radiation. In some embodiments, the first sensitizer 306 includes a PHS chemical structure. Note that the PHS chemical structure in the first sensitizer 306 functions to enhance the sensitivity of the resist material 300 and the polymer backbone 302 may include PHS polymer backbone or alternatively other polymer backbone, such as COMA.

A resist material may not be sensitive enough to the first radiation but is more sensitive to the second radiation. Thus, by incorporating the first sensitizer 306, the resist material has an enhanced sensitivity to the first radiation. For example, the first sensitizer 306 generates the second radiation in response to the first radiation and the PAG 310 generates acid in response to the second radiation. The first sensitizer may enhance the sensitivity by other mechanism. For example, the first sensitizer may also generate a secondary electron in response to the first radiation.

The more number of the first sensitizer 306 are bonded to the polymer backbone 302, the resist material 300 is more sensitive to the first radiation. However, the number of the side locations in the polymer backbone 302 is limited. When more first sensitizers 306 are bonded to the polymer backbone 302, the number of the ALGs 304 bonded to the polymer backbone 302 is reduced. Thus, the resist material 300 is improved on one aspect but is degraded on another aspect.

As noted above, the resist material 300 also includes the second sensitizer 308 that is not chemically bonded to the polymer backbone 302. The second sensitizer 308 is similar to the first sensitizer 306 in term of function. Particularly, the second sensitizer 308 is designed to be able to generate the second radiation in response to the first radiation. The second sensitizer 308 may additionally or alternatively generate a secondary electron in response to the first radiation. Since the second sensitizer 308 is not bonded with the polymer backbone 302 but is blended in the resist material 300, the number of the second sensitizer 308 to be incorporated in the resist material 300 is adjustable and can be very higher. With collective contributions from the first and second sensitizers, the sensitivity of the resist material 300 is substantially improved. The number of the second sensitizer 308 in the resist material 300 is tuned to reach the desired exposing threshold. In some embodiments, a molar concentration ratio of the second sensitizer 308 over the first sensitizer 306 in the photoresist layer ranges between 0.5 and 10.

Thus designed resist material 300 has an exposing sensitivity to the first radiation of 20 millijoule/cm$^2$ (mJ/cm$^2$) or less, such as 10 mJ/cm$^2$. The exposing sensitivity is defined as the minimum exposing dose required for chemical modification or the exposing threshold. In other words, the exposing threshold is 20 mJ/cm$^2$ or less.

In some embodiments, the second sensitizer 308 includes one of a fluorine-containing chemical, a metal-containing chemical, a phenol-containing chemical and a combination thereof. In some embodiments, the second sensitizer 308 includes polyhydroxystyrene, poly-fluorostyrene, or polychlorostyrene. The second sensitizer may link to each other, thereby forming a ring structure or a polymer chain.

Figure 7:
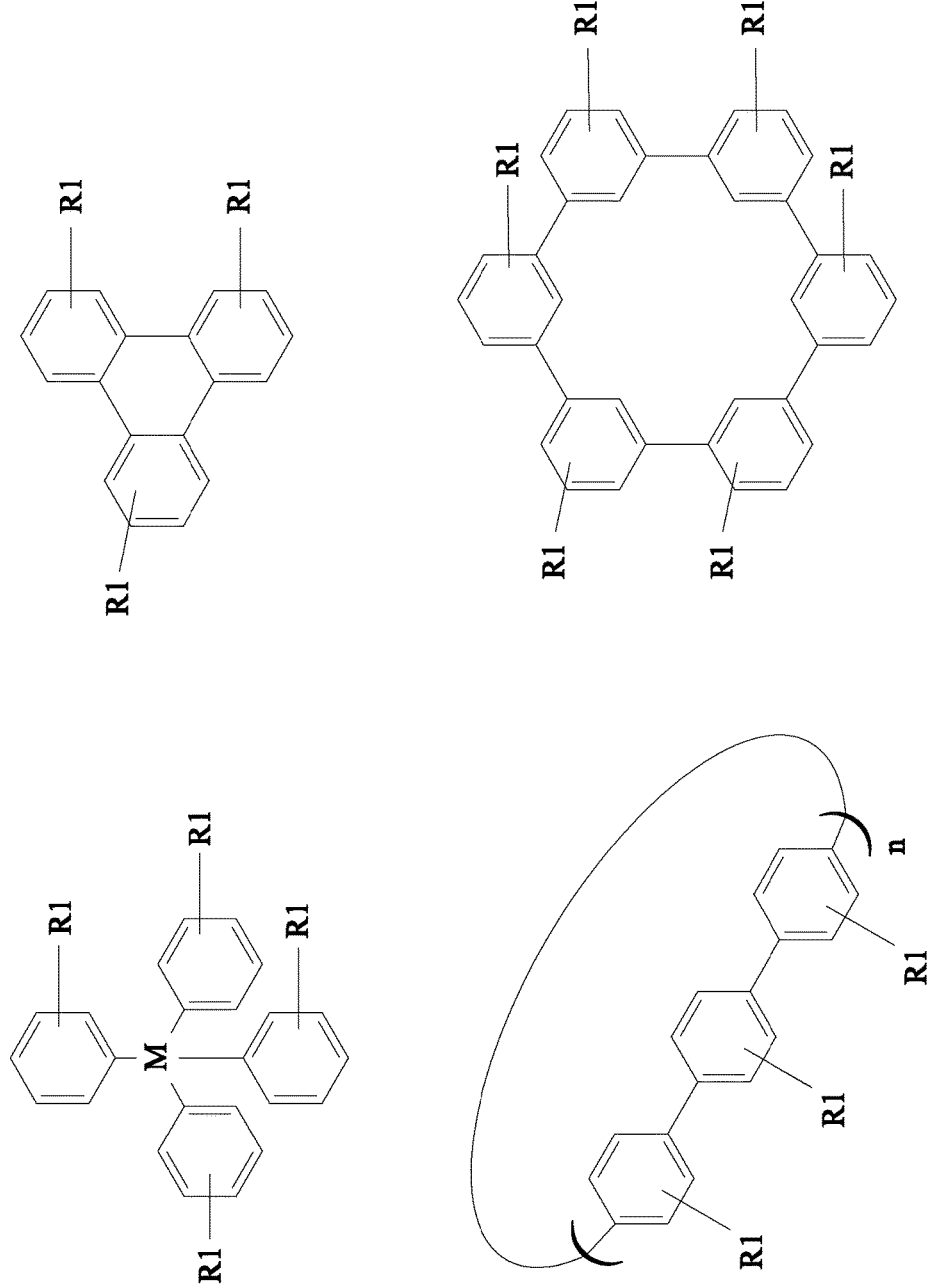

The second sensitizer 308 may have a similar chemical structure as the first sensitizer 306; alternatively may have a different chemical structure but the same function as the first sensitizer 306; or may include both. For examples, second sensitizer 308 includes a PHS chemical group. In some examples, the second sensitizer 308 includes one or more materials represented as in FIG. 7 and below:

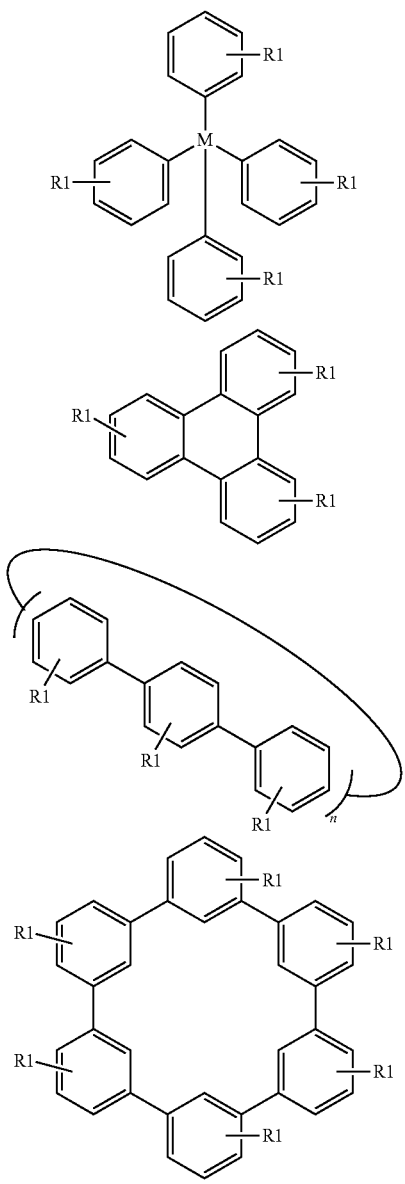

wherein $R_1$ is selected from a group consisting of a hydroxyl group, fluorine, hydrogen, alkyl fluoroalcohol, chloride, and a fluoroalkyl group; M may include either a carbon atom or a silicon atom; n is an integer that ranges between 1 to 20.

Referring back to FIG. 3, the PAG 310 is designed to be sensitive radiation and is able to generate acid in response to the radiation. In various examples, the PAG 310 is sensitive to the first radiation, the second radiation or both. Usually the PAG 310 is not sensitive enough to the first radiation. With more sensitizers, such as the first sensitizer 306 and the second sensitizer 308, the sensitivity of the resist material 300 is improved. In the present example, the PAG 310 is blended with the first polymer 306 in the resist material 300.

In some examples for illustration, the PAG 310 may include perfluorosulfonate, diphenyliodonium trifluoromethane sulfonate, diphenyliodonium nonafluorobutane sulfonate, triphenylsulfonium trifluromethane sulfonate, triphenylsulfonium nonafluorobutane sulfonate, triphenylsulfonium bis(perfluoromethanesulfonyl) imide, ethanone, ethanone, triazine, or combinations thereof.

The first polymer 314, PAG 310 and the second sensitizer 308 are all mixed in the solvent 312. With collective contributions from the first and second sensitizers, the sensitivity of the resist material 300 is substantially improved.

Figure 6:
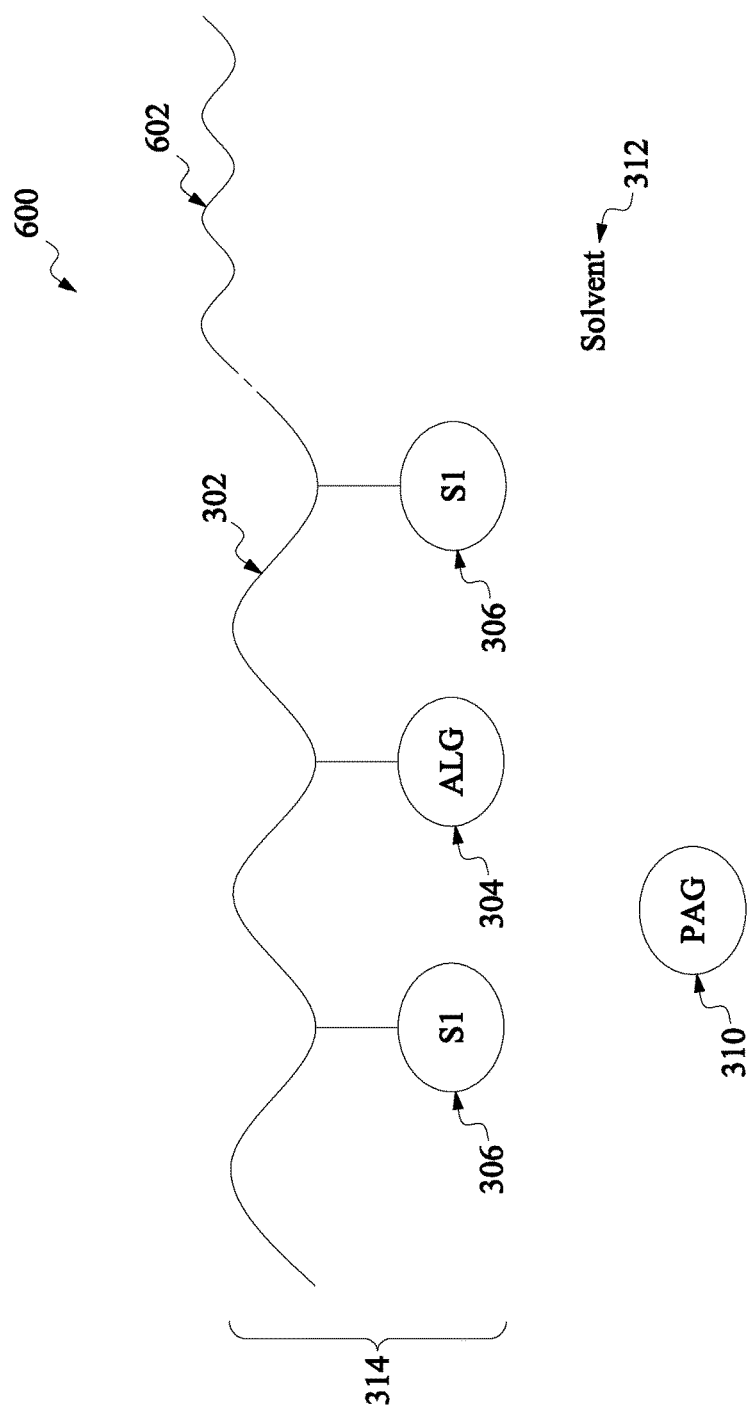
FIG. 6 illustrates a photoresist material of FIG. 2A in accordance with other embodiments.

In an alternative embodiment illustrated in FIG. 6, the resist layer 206 may include a resist material 600 that has a different structure to incorporate additional sensitizer. The resist material 600 is similar to the resist material 300 on one aspect. For example, the resist material 600 includes the first polymer 314 and the PAG 310 mixed in the solvent 312. The first polymer 314 further includes the polymer backbone 302, the ALG 304 and the first sensitizer 316, in which the ALG 304 and the first sensitizer 316 are bonded to the polymer backbone 302. However, on another aspect, the resist material 600 includes a second polymer 602 that is sensitive to the first radiation to further enhance the sensitivity of the resist material. In a specific embodiment, the second polymer 602 may have a molecular weight ranging between 200 Dalton and 20000 Dalton.

Particularly, the second polymer 602 is designed to be able to generate a second radiation having a second wavelength in response to the first radiation. In the present example, the first radiation is EUV light and the first wavelength is about 13.5 nm; and the second wavelength ranges between 180 nm and 250 nm. The second polymer 602 absorbs the first radiation and radiates the second radiation. The second polymer 602 also serves as a sensitizer of the resist material 600. Additionally, the second polymer 602 may generate secondary electrons in response to the first radiation. Thus, both of the first sensitizer 306 and the second polymer 602 collectively contribute to enhance the sensitivity of the resist material 600. As such, on one hand, the resist material 600 may not be subjected to suffer the above-identified trade-off issue on available bonding amounts to a single polymer backbone. On the other hand, in response to the first radiation (e.g., EUV radiation), there may be more second radiation (or additionally secondary electrons) being generated in the resist material 600, which in turn, may lower an energy threshold needed to respond to the first radiation. In the specific embodiments, the energy threshold needed in the present disclosure may be lower than 20 mJ/cm².

Figure 8:
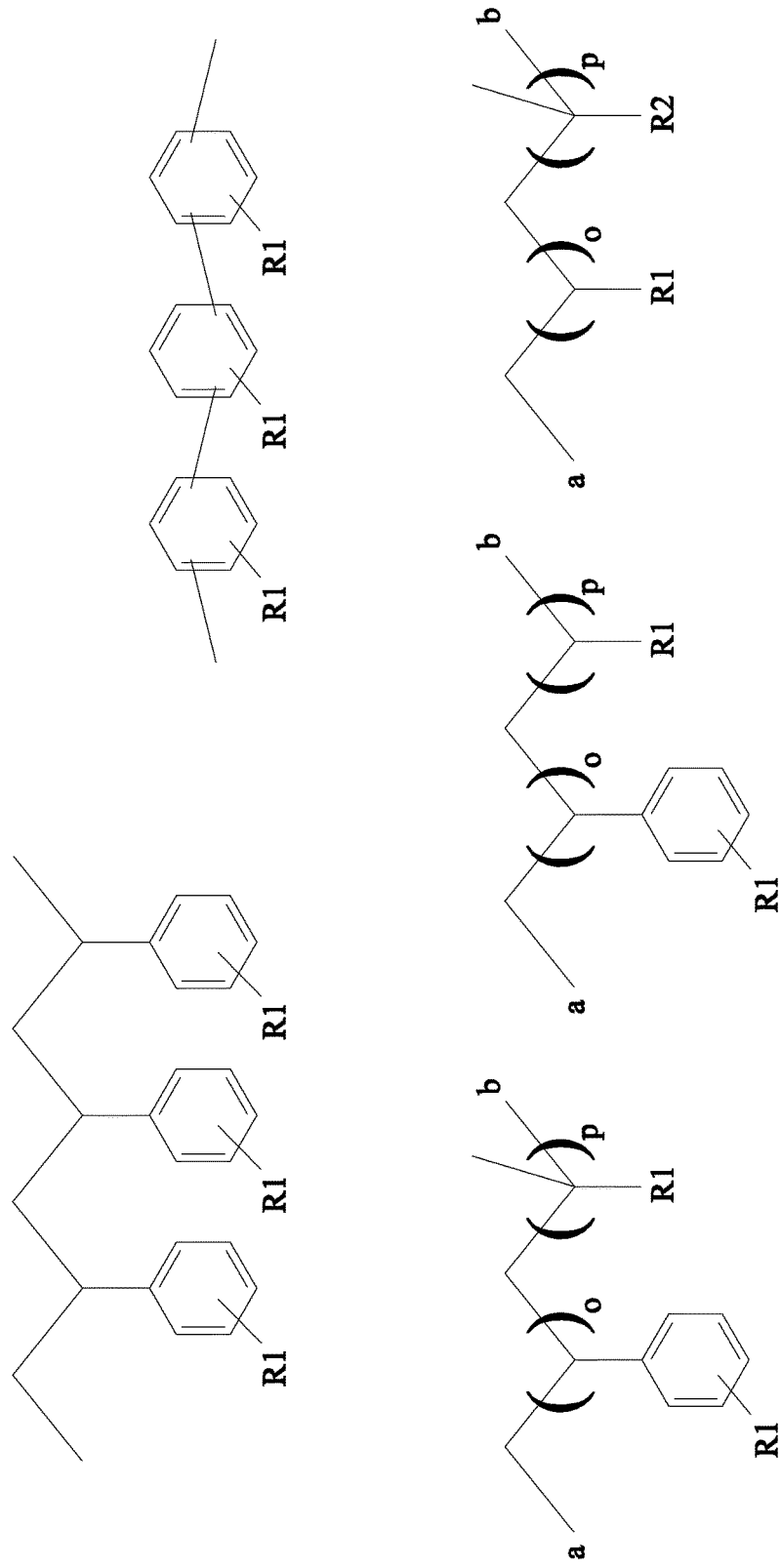
FIG. 8 illustrates chemical structures in the photoresist material of FIG. 6 in accordance with some embodiments.

In some embodiments, the second polymer 602 is mixed with the first polymer 314 and the PAG 310 in the solvent 312. In some other embodiments, the second polymer 602 is branched/extended from the first polymer backbone. In various examples, the second polymer 602 may include one or more materials represented as in FIG. 8 and below:

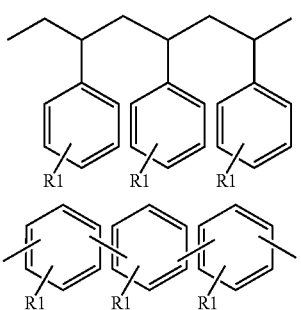

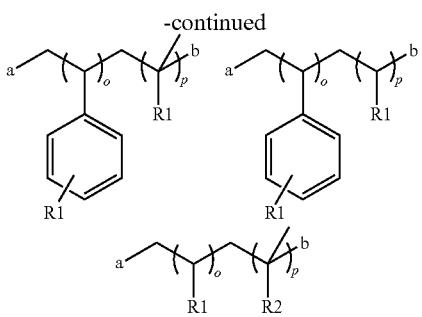

wherein $R_1$ is selected from a group consisting of a hydroxyl group, fluorine, hydrogen, alkyl fluoroalcohol, chloride, and a fluoroalkyl group; $R_2$ is selected from a group consisting of a hydroxyl group, fluorine, hydrogen, alkyl fluoroalcohol, chloride, and a fluoroalkyl group; "o" may range between 0 to 1; "p" may range between 0 to 1; "a" and "b" refer to two ends and the end "a" may chemically link to the end "b".

Referring to FIGS. 1 and 2B, the method 100 proceeds to operation 106 by performing an exposing process to the resist layer 206 to the first radiation beam in a lithography system. In some embodiments, the first radiation is a EUV radiation (e.g., 13.5 nm). In some embodiments, the first radiation may be an I-line (365 nm), a DUV radiation such as KrF excimer laser (248 nm), ArF excimer laser (193 nm), a EUV radiation, an x-ray, an e-beam, an ion beam, and/or other suitable radiations. The operation 106 may be performed in air, in a liquid (immersion lithography), or in a vacuum (e.g., for EUV lithography and e-beam lithography). In some embodiments, the radiation beam is patterned with a mask, such as a transmissive mask or a reflective mask, which may include resolution enhancement techniques such as phase-shifting, off-axis illumination (OAI) and/or optical proximity correction (OPC). In some other embodiments, the radiation beam is directly modulated with a predefined pattern, such as an IC layout, without using a mask (such as using a digital pattern generator or direct-write mode). In the present embodiment, the radiation beam is a EUV radiation and the operation 106 is performed in a EUV lithography system, such as the EUV lithography system. Since the sensitivity of the resist layer 206 is enhanced and the exposing threshold of the resist layer may be lower than 20 mJ/cm². Accordingly, the exposing process is implemented with the dose less than 20 mJ/cm².

Still referring to the operation 106, after the exposure, the operation 106 may further include other steps, such as thermal treatment. In the present embodiment, the operation 106 includes a post-exposure baking (PEB) process to the semiconductor structure 200, especially to the resist layer 206 coated on the substrate 202. During the PEB process, the ALG 304 in the exposed resist material is cleaved, the exposed portions of the resist material 300 are changed chemically (such as more hydrophilic or more hydrophobic). In a specific embodiment, the PEB process may be performed in a thermal chamber at temperature ranging between about 120° C. to about 160° C.

After the operation 106, a latent pattern is formed on the resist layer 206. The latent pattern of a resist layer refers to the exposed pattern on the resist layer, which eventually becomes a physical resist pattern, such as by a developing process. The latent pattern of the resist layer 206 includes unexposed portions 206a and exposed portions 206. In the present case, of the latent pattern, the exposed portions 206b of the resist layer 206 are physically or chemically changed.

In some examples, the exposed portions 206b are de-protected, inducing polarity change for dual-tone imaging (developing). In other examples, the exposed portions 206b are changed in polymerization, such as depolymerized as in positive resist or cross-linked as in negative resist.

Referring to FIGS. 1 and 2C, the method 100 then proceeds to operation 108 by developing the exposed resist layer 206 in a developer, constructed in accordance with some embodiments. By the developing process, a patterned resist layer 206' is formed. In some embodiments, the resist layer 206 experiences a polarity change after the operation 106, and a dual-tone developing process may be implemented. In some examples, the resist layer 206 is changed from a nonpolar state (hydrophobic state) to a polar state (hydrophilic state), then the exposed portions 206b will be removed by an aqueous solvent (positive tone imaging), such as tetramethyl ammonium hydroxide (TMAH), or alternatively the unexposed portions 206a will be removed by an organic solvent (negative tone imaging), such as butyl acetate. In some other examples, the resist layer 206 is changed from a polar state to a nonpolar state, then the exposed portions 206b will be removed by an organic solvent (positive tone imaging) or the unexposed portions 206a will be removed by an aqueous solvent (negative tone imaging).

In the present example illustrated in FIG. 2C, the unexposed portions 206a are removed in the developing process. In this example shown in FIG. 2C, the patterned resist layer 206' is represented by two line patterns. However, the following discussion is equally applicable to resist patterns represented by trenches.

Figure 2E:
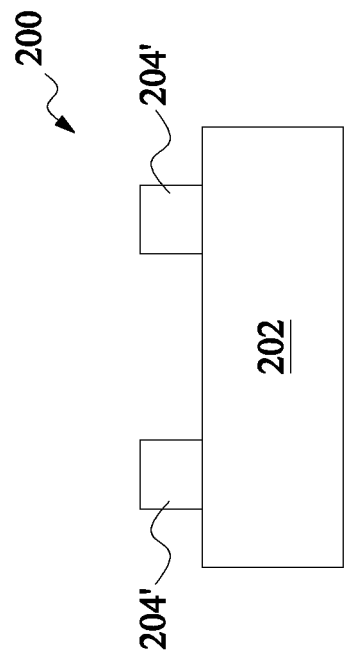
Figure 2D:
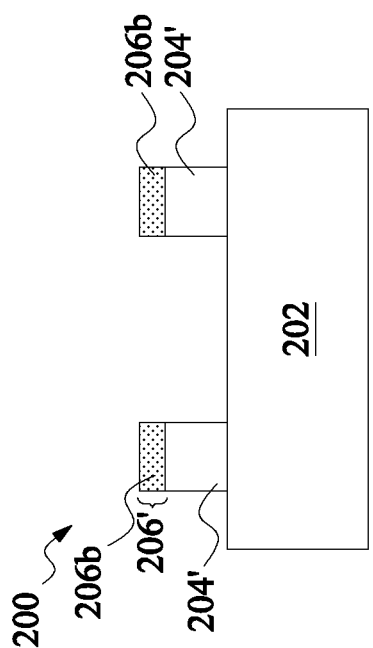

Referring to FIGS. 1 and 2D, the method 100 includes an operation 110 by performing a fabrication process to the semiconductor structure 200 using the patterned resist layer 206' as a mask such that the fabrication process is only applied to the portions of the semiconductor structure 200 within the openings of the patterned resist layer 206' while other portions covered by the patterned resist layer 206' are protected from being impacted by the fabrication process. In some embodiments, the fabrication process includes an etching process applied to the material layer 204 using the patterned resist layer 206' as an etch mask, thereby transferring the pattern from the patterned resist layer 206' to the material layer 204. In alternative embodiments, the fabrication process includes an ion implantation process applied to the semiconductor structure 200 using the patterned resist layer as an implantation mask, thereby forming various doped features in the semiconductor structure 200.

In the present example, the material layer 204 is a hard mask layer. To further this embodiment, the pattern is first transferred from the patterned resist layer 206' to the hard mask layer 204, then to other layers of the substrate 202. For example, the hard mask layer 204 may be etched through openings of the patterned resist layer 206' using a dry (plasma) etching, a wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 206' may be partially or completely consumed during the etching of the hard mask layer 204. In an embodiment, any remaining portion of the patterned resist layer 206' may be stripped off, leaving a patterned hard mask layer 204' over the substrate 202, as illustrated in FIG. 2E.

Although not shown in FIG. 1, the method 100 may include other operations before, during or after the operations described above. In an embodiment, the substrate 202 is a semiconductor substrate and the method 100 proceeds to forming fin field effect transistor (FinFET) structures. In this embodiment, the method 100 includes forming a plurality of active fins in the semiconductor substrate 202. In furtherance of the embodiment, the operation 110 further includes etching the substrate 202 through the openings of the patterned hard mask 204' to form trenches in the substrate 202; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes in the semiconductor substrate 202. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to form a plurality of trenches. The method 100 proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 200 and the material layer 306 according to various aspects of the present disclosure.

The present disclosure provides a photoresist material with enhanced sensitivity and a lithography method using the same. More specifically, the resist material includes a first polymer, a first sensitizer that is bonded to the first polymer backbone, and a second sensitizer that is not bonded to the first polymer backbone. In some examples, a molar concentration ratio of the second sensitizer over the first sensitizer in the photoresist layer ranges between 0.5 and 10. In some examples, the second sensitizer is second polymer blended with or attached to the first polymer. Accordingly, the sensitivity of the resist material is enhanced without sacrificing the number of the acid-labile groups bonded to the first polymer. Expose dose can be tuned to below 20 mJ/cm$^2$.

The present disclosure provides an embodiment of a method for lithography patterning. The method includes forming a photoresist layer over a substrate, wherein the photoresist layer includes a polymer backbone, an acid labile group (ALG) bonded to the polymer backbone, a first sensitizer that is bonded to the polymer backbone, a second sensitizer that is not bonded to the polymer backbone, and a photo-acid generator (PAG). The method further includes performing an exposing process to the photoresist layer; and developing the photoresist layer, thereby forming a patterned photoresist layer.

The present disclosure provides another embodiment of a method for lithography patterning. The method includes forming a photoresist layer over a substrate. The photoresist layer has a sensitivity greater than 20 millijoule/cm$^2$ (mJ/cm$^2$). The photoresist layer includes a first polymer having a first polymer backbone, an acid labile group (ALG) boned to the polymer backbone, and a first sensitizer bonded to the polymer backbone, a second polymer having a plurality of second sensitizers, and a photoacid generator (PAG) blended with the first polymer and the second polymer. Each of the first sensitizer and the second sensitizers is capable of generating a first radiation of a first wavelength in response to a second radiation of a second wavelength. The second wavelength is less than the first wavelength. A molar concentration ratio of the second sensitizers over the first sensitizer in the photoresist layer ranges between 0.5 and 10. The method further includes performing an exposing process to the photoresist layer using the second radiation; and developing the photoresist layer to form a patterned photoresist layer.

The present disclosure provides an embodiment of a photoresist. The photoresist includes a first polymer that includes a polymer backbone, an acid labile group (ALG) that is bonded to a first site of the backbone, and a first sensitizer that is bonded to a second site of the backbone; a second sensitizer; and a photoacid generator (PAG) that is capable of generating acid in response to the second radiation. Each of the first sensitizer and the second sensitizer is capable of generating a first radiation of a first wavelength in response to a second radiation of a second wavelength less than the first wavelength. A molar concentration ratio of the second sensitizers over the first sensitizer in the photoresist layer ranges between 0.5 and 10. The photoresist has a sensitivity greater than 20 millijoule/cm$^2$ (mJ/cm$^2$).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
forming a photoresist layer over a substrate, wherein the photoresist layer includes a polymer backbone, the polymer being a poly(norbornene)-co-malaic anhydride (COMA) polymer, an acid labile group (ALG) bonded to a first side location of the polymer backbone, a first sensitizer that is bonded to a second side location of the polymer backbone, one or more of a second sensitizer that is not bonded to the polymer backbone, and a photo-acid generator (PAG), the second sensitizer being selected from the group consisting of:

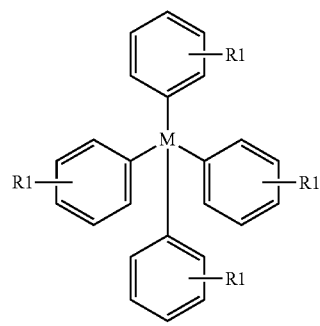

-continued

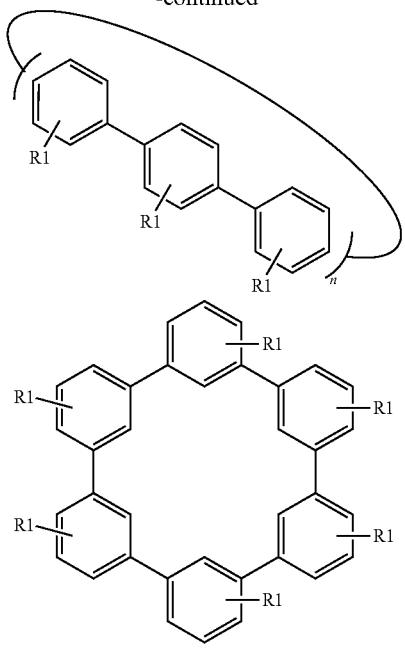

wherein R₁ is selected from a group consisting of fluorine, alkyl fluoroalcohol, chloride, and a fluoroalkyl group; n is an integer that ranges between 1 to 20; and M is one of carbon and silicon;

performing an exposing process to the photoresist layer; and developing the photoresist layer, thereby forming a patterned photoresist layer.

2. The method of claim 1, wherein the performing of the exposing process to the photoresist layer includes exposing a portion of the photoresist layer to a first radiation; and the photoresist layer has a sensitivity to the first radiation less than 20 millijoule/cm² (mJ/cm²).

3. The method of claim 2, wherein the first radiation is an extreme ultraviolet (EUV) radiation having a first wavelength.

4. The method of claim 3, wherein the second sensitizer is able to generate a second radiation having a second wavelength in response to the first radiation, the second wavelength being greater than the first wavelength; and the PAG is capable of generating an acid in response to the second radiation.

5. The method of claim 4, wherein the first wavelength is about 13.5 nm and the second wavelength ranges between 180 nm and 250 nm.

6. The method of claim 3, wherein the second sensitizer is able to generate a secondary electron in response to the first radiation.

7. The method of claim 4, the photoresist layer comprising more than one second sensitizers, each second sensitizer being able to generate the second radiation in response to the first radiation.

8. The method of claim 1, wherein the first sensitizer includes a PHS chemical group.

9. The method of claim 1, wherein a molar concentration ratio of the second sensitizer over the first sensitizer in the photoresist layer ranges between 0.5 and 10.

10. The method of claim 1, wherein the second sensitizer is selected from one or more of the following structures:

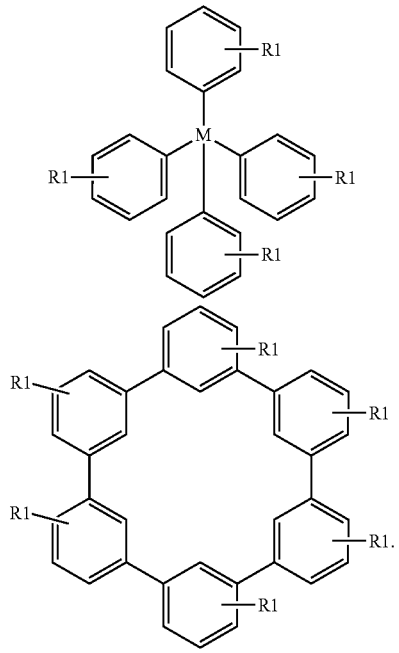

11. A method for lithography patterning, comprising:

forming a photoresist layer over a substrate, wherein the photoresist layer has a sensitivity greater than 20 millijoule/cm² (mJ/cm²), the photoresist layer includes a first polymer having a first polymer backbone, the first polymer being a poly(norbornene)-co-malaic anhydride (COMA) polymer, an acid labile group (ALG) bonded to a first side location of the first polymer backbone, and a first sensitizer bonded to a second side location of the first polymer backbone, a second polymer comprising a plurality of second sensitizers, wherein each of the first sensitizer and the second sensitizers is capable of generating a first radiation of a first wavelength in response to a second radiation of a second wavelength, wherein the second wavelength is less than the first wavelength, wherein a molar concentration ratio of the second sensitizers over the first sensitizer in the photoresist layer ranges between 0.5 and 10, wherein the second polymer is not bonded to the first polymer, is not bonded with any ALG, is different from the first polymer in composition, and includes a plurality of chemical structures each being selected from the group consisting of:

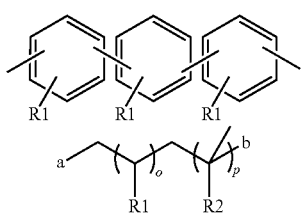

wherein R₁ is selected from the group consisting of fluorine, hydrogen, alkyl fluoroalcohol, chloride, and a fluoroalkyl group;

wherein R$_2$ is selected from the group consisting of a hydroxyl group, fluorine, hydrogen, alkyl fluoroalcohol, chloride, and a fluoroalkyl group;
wherein o ranges between 0 to 1;
wherein p ranges between 0 to 1; and
wherein a and b refer to two ends and the end a is chemically linkable to the end b; and
  a photoacid generator (PAG) blended with the first polymer and the second polymer;
performing an exposing process to the photoresist layer using the second radiation; and
developing the photoresist layer to form a patterned photoresist layer.

12. The method of claim 11, wherein
the second radiation has a second wavelength of about 13.5 nm and the first radiation has a first wavelength ranging between 180 nm and 250 nm; and
the performing of the exposing process to the photoresist layer includes exposing portions of the photoresist layer to the second radiation with an exposure dose less than about 20 mJ/cm$^2$.

13. The method of claim 11, wherein
the first sensitizer includes polystyrenehydroxyl (PHS); and
the second sensitizer includes one or more of the following structures;

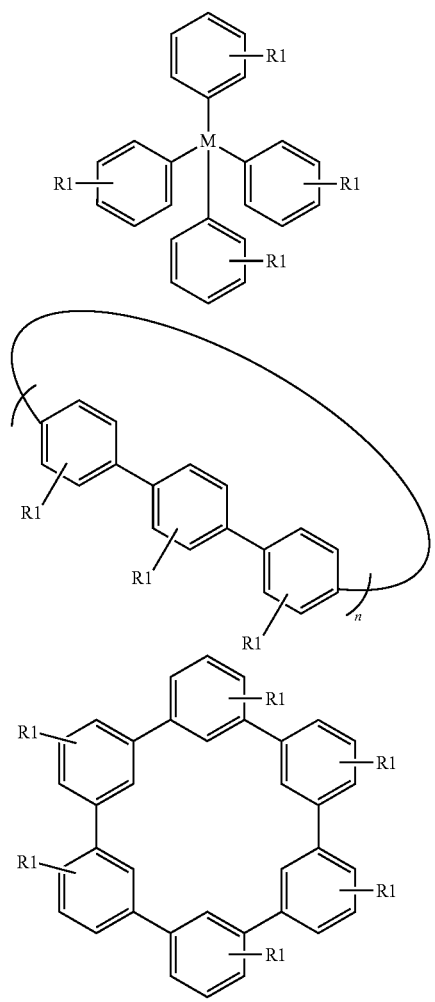

wherein R$_1$ is selected from a group consisting of fluorine, hydrogen, alkyl fluoroalcohol, chloride, and a fluoroalkyl group; n is an integer that ranges between 1 to 20; and M is one of carbon and silicon.

14. The method of claim 11, wherein
the second polymer generates secondary electrons in response to the first radiation; and
the second polymer has a molecular weight ranging between about 200 Daltons to about 20000 Daltons.

15. A photoresist, comprising:
a first polymer backbone, the first polymer backbone being a poly(norbornene)-co-malaic anhydride (COMA) polymer, an acid labile group (ALG) that is bonded to a first side location of the backbone, and a first sensitizer that is bonded to a second side location of the backbone;
a second sensitizer that is not bonded to the first polymer backbone, wherein the second sensitizer is selected from the following structures:

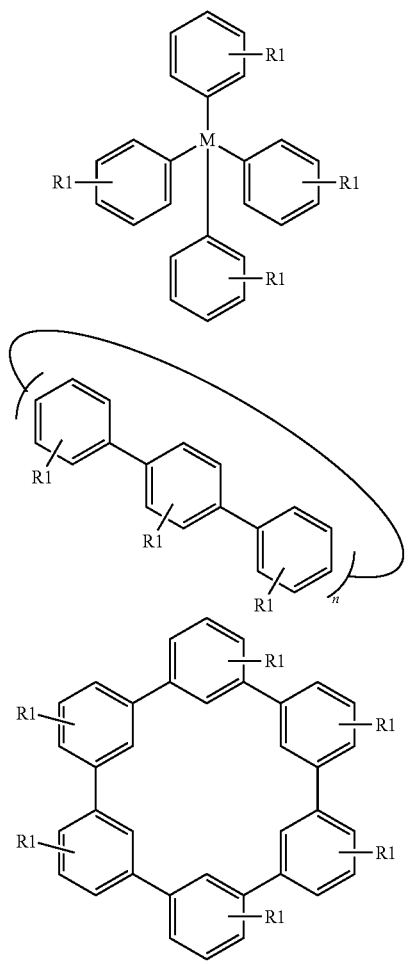

wherein R$_1$ is selected from a group consisting of fluorine, hydrogen, alkyl fluoroalcohol, chloride, and a fluoroalkyl group; n is an integer that ranges between 1 to 20; and M is one of carbon and silicon; and
wherein each of the first sensitizer and the second sensitizer is capable of generating a first radiation of a first wavelength in response to a second radiation of a second wavelength less than the first wavelength, wherein a molar concentration ratio of the second sensitizers over the first sensitizer in the photoresist layer ranges between 0.5 and 10; and a photoacid generator (PAG) that is capable of generating acid in response to the second radiation, wherein the photoresist has a sensitivity greater than 20 millijoule/ cm² (mJ/cm²).

16. The photoresist of claim 15, wherein the second sensitizer generates secondary electrons in response to the second radiation.

17. The photoresist of claim 15, wherein the second sensitizer is selected from the group consisting of:

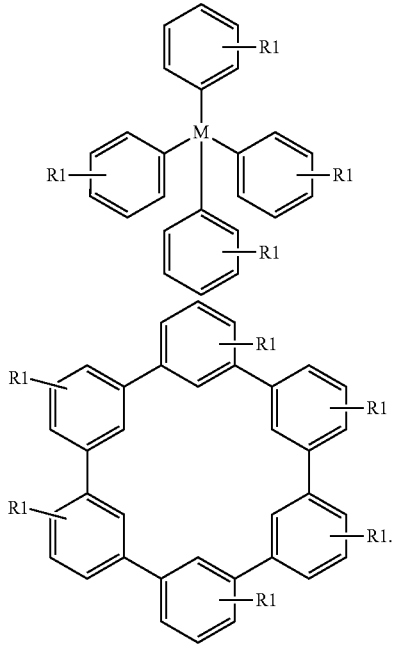

18. The photoresist of claim 15, wherein the first polymer backbone is branched and/or extended with a second polymer having a backbone including one or more of the structure selected from the group consisting of:

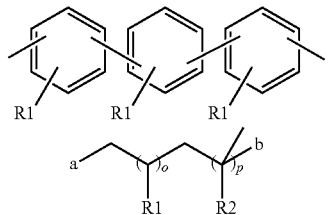

wherein $R_1$ is selected from the group consisting of fluorine, hydrogen, alkyl fluoroalcohol, chloride, and a fluoroalkyl group;

wherein $R_2$ is selected from the group consisting of a hydroxyl group, fluorine, hydrogen, alkyl fluoroalcohol, chloride, and a fluoroalkyl group;

wherein o ranges between 0 to 1;

wherein p ranges between 0 to 1; and wherein a and b refer to two ends and the end a is chemically linkable to the end b.

19. The photoresist of claim 18, wherein the second polymer includes a plurality of the first sensitize or the second sensitizer bonded to side locations thereon.

20. The photoresist of claim 18, wherein the polymer has a backbone including one or more of the structure selected from the group consisting of:

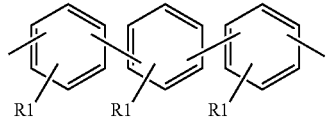

* * * * *